United States Patent
Verma et al.

(10) Patent No.: US 11,941,335 B1
(45) Date of Patent: Mar. 26, 2024

(54) PROVIDING CONCISE DATA FOR ANALYZING CHECKER COMPLETENESS

(71) Applicant: Cadence Design Systems, Inc., San Jose, CA (US)

(72) Inventors: Amit Verma, Uttar Pradesh (IN); Yumi Monma, Belo Horizonte (BR); David Spatafore, Maple Grove, MN (US); Suyash Kumar, Uttar Pradesh (IN); Devank Jain, Uttar Pradesh (IN)

(73) Assignee: Cadence Design Systems, Inc., San Jose, CA (US)

( * ) Notice: Subject to any disclaimer, the term of this patent is extended or adjusted under 35 U.S.C. 154(b) by 449 days.

(21) Appl. No.: 17/152,289

(22) Filed: Jan. 19, 2021

(51) Int. Cl.
*G06F 30/327* (2020.01)
*G06F 30/31* (2020.01)

(52) U.S. Cl.
CPC ............ *G06F 30/327* (2020.01); *G06F 30/31* (2020.01)

(58) Field of Classification Search
CPC ...................................................... G06F 30/327

USPC ........................................................ 716/106
See application file for complete search history.

(56) References Cited

U.S. PATENT DOCUMENTS

2013/0117722 A1* 5/2013 Biswas ............... G06F 11/3676
716/107

* cited by examiner

*Primary Examiner* — Eric D Lee
(74) *Attorney, Agent, or Firm* — Foley & Lardner LLP

(57) ABSTRACT

Methods and systems for providing concise data for analyzing checker completeness, in the context of formal verification analysis of circuit designs. The methods and systems concisely report information useful to a human user (e.g., circuit designer or verification engineer) for efficiently determining what manual action should be taken next to resolve holes in verification coverage. The reported information can include lists of signals on which checkers can be written, which lists can be ranked, can be limited to a subset of interest signals, and can include corresponding cover items for each reported interest signal. The present systems and methods thereby improve on reporting provided to the user, permitting the user to more quickly advance a formal verification process toward full coverage of the relevant portions of a circuit design.

5 Claims, 14 Drawing Sheets

```
000    module shift(a, clk, rst);
001    input a, clk, rst;
002    reg[4:0] state;
003
004    wire w0 = state[0];
005    wire w1 = state[1];
006    wire w2 = state[2];
007    wire w3 = state[3];
008
009    always @(posedge clk)
010    begin
011        if (rst)
012            state <= 5'b00000;
013        else
014            begin
015                state[0] <= a;
016
017                state[1] <= w0;
018                state[2] <= w1;
019                state[3] <= w2 || w1;
020
021                state[4] <= w3;
022            end
023    end
024    endmodule
```

FIG. 2

CHECKER COMPLETENESS APPROACHES – STRUCTURAL

CHECKER COMPLETENESS APPROACHES – FUNCTIONAL

```
001  module top(input clk, reset, in1, in2, in3, output reg [1:0] out1, out2, out3);
002      always @(posedge clk or posedge rst)
003      begin
004          if(rst)  out1 <= 2'b00;
005          else if ({in1, in2} == 2'b00)
006              out1 <= 2'b01;
007          else if ({in1, in2} == 2'b01)
008              out1 <= 2'b10;
009      end
010      always @(posedge clk or posedge rst)
011      begin
012          if(rst)  out2 <= 2'b00;
013          else if ({in1, in3} == 2'b00)
014              out2 <= 2'b01;
015          else if ({in1, in3} == 2'b01)
016              out2 <= 2'b10;
017      end
018      always @(posedge clk or posedge rst)
019      begin
020          if(rst)  out3 <= 2'b00;
021          else    out3 <= out2 || out1;
022
023      Prop1 : assert always (out1 <= 2'b10);
024  endmodule
```

FIG. 6A

```
001    module top(input clk, reset, in1, in2, in3, output reg [1:0] out1, out2, out3);
002      always @(posedge clk or posedge rst)
003      begin
004        if(rst)   out1 <= 2'b00;
005        else if ({in1, in2} == 2'b00)
006              out1 <= 2'b01;
007        else if ({in1, in2} == 2'b01)
008              out1 <= 2'b10;
009      end
010      always @(posedge clk or posedge rst)
011      begin
012        if(rst)   out2 <= 2'b00;
013        else if ({in1, in3} == 2'b00)
014              out2 <= 2'b01;
015        else if ({in1, in3} == 2'b01)
016              out2 <= 2'b10;
017      end
018      always @(posedge clk or posedge rst)
019      begin
020        if(rst)   out3 <= 2'b00;
021        else      out3 <= out2 || out1;
022
023    Prop1 : assert always (out1 <= 2'b10);
024    endmodule
```

Labels on lines: covitm1 (004), covitm2 (006), covitm3 (008), covitm4 (012), covitm5 (014), covitm6 (016), covitm7 (020), covitm8 (021). Annotations: 602 → line 023; 604 → lines 002–009; 606 → lines 010–021; 600 overall.

FIG. 6B

```
001  module top(input clk, reset, in1, in2, in3, output reg [1:0] out1, out2, out3);
002  always @(posedge clk or posedge rst)
003  begin
004      if(rst)  out1 <= 2'b00;
005      else if ({out2, out3} == 2'b00)
006          out1 <= 2'b01;
007      else if ({out2, out3} == 2'b01)
008          out1 <= 2'b10;
009  end
010  always @(posedge clk or posedge rst)
011  begin
012      if(rst)  out2 <= 2'b00;
013      else if ({in1, in3} == 2'b00)
014          out2 <= 2'b01;
015      else if ({in1, in3} == 2'b01)
016          out2 <= 2'b10;
017  end
018  always @(posedge clk or posedge rst)
019  begin
020      if(rst)  out3 <= 2'b00;
021      else    out3 <= out2 || out1;
022
023  Prop1 : assert always (out1 <= 2'b10);
024  endmodule
```

FIG. 6C

```
001   module top(input clk, reset, in1, in2, in3, output reg [1:0] out1, out2, out3);
002   always @(posedge clk or posedge rst)
003   begin
covitm1    if(rst)   out1 <= 2'b00;
005        else if ({out2, out3} == 2'b00)
covitm2        out1 <= 2'b01;
007        else if ({out2, out3} == 2'b01)
covitm3        out1 <= 2'b10;
009   end
010   always @(posedge clk or posedge rst)
011   begin
covitm4    if(rst)   out2 <= 2'b00;
013        else if ({in1, in3} == 2'b00)
covitm5        out2 <= 2'b01;
015        else if ({in1, in3} == 2'b01)
covitm6        out2 <= 2'b10;
017   end
018   always @(posedge clk or posedge rst)
019   begin
covitm7    if(rst)   out3 <= 2'b00;
covitm8    else    out3 <= out2 || out1;
022
023   Prop1 : assert always (out1 <= 2'b10);
024   endmodule
```

FIG. 6D

PROVIDING CONCISE DATA FOR ANALYZING CHECKER COMPLETENESS

TECHNICAL FIELD

The present invention relates generally to electronic design automation (EDA) tools and techniques, and specifically to methods, systems, and computer-readable media for providing concise data for analyzing checker completeness.

BACKGROUND

Electronic design automation (EDA) uses software tools for design and analysis of complex digital electronic systems such as printed circuit boards (PCBs) and integrated circuits (ICs). So as to ensure correct operability of a complicated digital electronic circuit design before significant investment is committed in the physical fabrication of chips or boards that use the design, and thus to avoid substantial waste and retooling, prior to fabrication of the design, a design can be required to pass a series of verification tests collectively referred to as "signoff."

Pre-production verification is a part of the digital semiconductor development cycle devoted to determining that a digital circuit design behaves as intended and within design specifications. Often performed prior to layout and routing phases of the development cycle, register transfer level (RTL) simulation and verification of a digital semiconductor design ensures that the design is logically correct and without major timing errors. In the context of pre-production verification, a design under test (DUT) is a software description of a hardware device intended to be fabricated, written using a specification language such as Specification and Description Language (SDL), for example, Verilog, VHDL, or System Verilog.

Formal verification involves the use of analytical techniques to prove that the implementation of a system conforms to the specification, which can be a set of design properties that the system must have. Formal verification uses mathematical techniques to prove that, under a set of constraints, a design property is either always correct, or to provide an example condition (called a counterexample) that demonstrates that the design property is false. Tools that use formal methods to verify RTL source code and design properties are known as "model checkers" or just "checkers" for short. Design properties to be verified include specifications and/or requirements that must be satisfied by the circuit design, and such properties are also known as "checkers." Since mathematical properties define the design requirements in pure mathematical terms, formal verification enables analysis of all possible valid inputs for a given circuit and is akin to an exhaustive simulation.

The effectiveness of formal verification depends on the completeness of the property set that is used to verify the circuit design. Broadly speaking, properties include covers, assumptions, and assertions, but assertions used to verify a circuit design, referred to herein as checkers, are the properties of chief concern herein. The property set should be sufficient to provide test coverage for the entirety of a portion of interest of the circuit design. The degree to which the circuit design is tested with the property set during formal verification can be quantified with a coverage metric. A low coverage metric indicates that more properties are needed to properly test the circuit design, whereas a high coverage metric indicates that the current property set is sufficient. Some coverage metrics can overestimate the coverage of a property set and mislead the circuit designer or verification engineer into believing that the current property set provides sufficient test coverage during formal verification when it actually does not.

Coverage is defined as the percentage of verification objectives that have been met during the verification of a DUT. Both structural methods (e.g., cone-of-influence) and functional methods (e.g., mutation, proof core) can be used to measure checker coverage to assess how completely an assertion set verifies a DUT.

SUMMARY

One example includes a computer-implemented method of structural checker completeness analysis. Checker start-point signals are collected from a design described by an RTL listing, then, using the checker start-point signals, a netlist of the design is traversed to collect structural COI signals. Before, after, or in parallel with the collection of structural COI signals, a list of all signals in the design is collected from the netlist. A computer processor is used to determine interest signals as the difference between the collected list of all signals in the design and the union of the checker start-point signals and the structural COI signals.

Another example includes a computer-implemented method of functional checker completeness analysis. Checker start-point signals are collected from a design described by an RTL listing, then, using the checker start-point signals, a netlist of the design is traversed to collect structural COI signals. Before, after, or in parallel with the collection of structural COI signals, and again using the checker start-point signals, the netlist is traversed to collect functional COI signals. A computer processor is used to determine interest signals as the difference between the structural COI signals and the functional COI signals.

Yet another example includes a computer-implemented method of checker completeness analysis. A computer processor is used to measure checker coverage following completion of a structural or functional formal verification analysis of a circuit design. The computer processor is used to performing RTL-based analysis of holes in the checker coverage to determine a list of interest signals on which one or more checkers can be written to reduce holes in the checker coverage. The computer processor is used to rank the list of interest signals by probable impact on the reduction in holes in the checker coverage. The sorted list of interest signals is then reported via a graphical user interface.

Still other examples include one or more computer-readable media configured to provide a computer as a system configured to perform any of the methods set forth above, or to execute in conjunction with a computer any of the methods set forth above.

BRIEF DESCRIPTION OF THE DRAWINGS

FIG. 2 is an example RTL description of the circuit design of FIG. 1 that can be verified during formal verification.

FIG. 6A is a structural analysis example annotated RTL listing showing visually distinct covered versus uncovered portions of a design, as may be displayed in a source browser.

FIG. 6B is a structural analysis example annotated RTL listing showing visually distinct covered versus uncovered portions of a design, with cover items tagged in the listing display.

FIG. 6C is a functional analysis example annotated RTL listing showing visually distinct covered versus uncovered portions of a design, as may be displayed in a source browser.

FIG. 6D is a functional analysis example annotated RTL listing showing visually distinct covered versus uncovered portions of a design, with cover items tagged in the listing display.

DETAILED DESCRIPTION

The present invention relates to methods and systems for providing concise data for analyzing checker completeness, in the context of formal verification analysis of circuit designs. EDA tools (e.g., formal verification tools) may report coverage metrics for formal analyses of a model of a design for an electronic circuit. However, such coverage metrics may have the disadvantage that they do not concisely report information useful to a human user (e.g., circuit designer or verification engineer) for efficiently determining what manual action should be taken next to resolve holes in verification coverage. The present systems and methods improve on reporting provided to the user, permitting the user to more quickly advance a formal verification process toward full coverage of the relevant portions of a circuit design.

Figure 1:
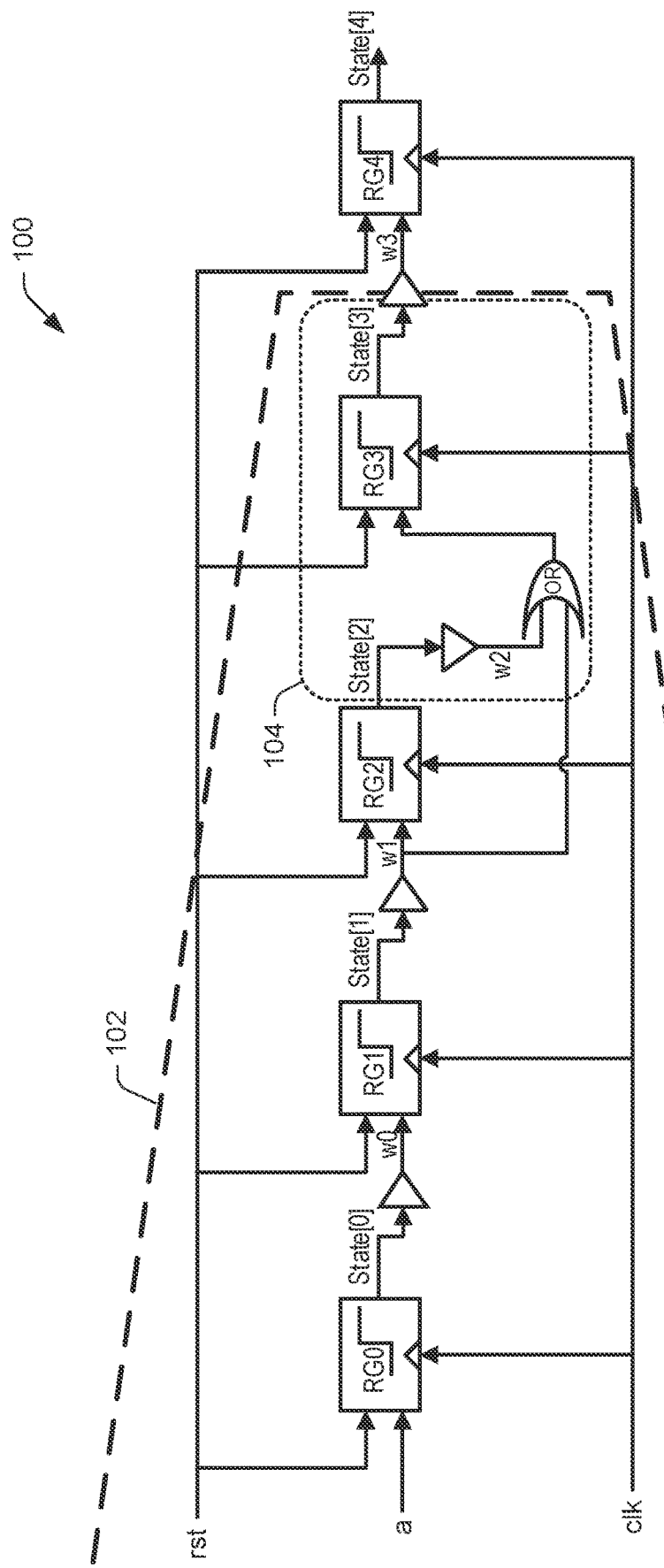
FIG. 1 is a gate-level representation of an example circuit design that can be verified during formal verification.

FIG. 1 is a gate-level representation of an example circuit design 100 that can be verified during formal verification. In the illustrated example, design 100 is a shift register that includes a chain of five registers RG[0:4]. Design 100 further includes logic elements (buffers, an OR gate) between the output of one register and the input of the next register that control the propagation of data from one register to the next. Design 100 includes three signal inputs for a reset signal rst, a data signal a, and a clock signal clk. The reset signal rst is connected to a reset input of each register and resets all of the registers when asserted. The clock signal clk is connected to a clock input of each register and controls the timing of data propagation through the registers. The data signal a includes input data that is to be shifted through the registers.

During formal verification, the circuit design is tested by attempting to prove the correctness of a property that has been written for the circuit design. A property is a specification or requirement that is to be satisfied by the circuit design and can describe a behavioral relationship between signals of the circuit design. An example of a property that can be verified during formal verification is the following property: state[2]|=>state[3] (Property P). Property P includes two parameters: state[2] and state[3]. Property P means that when signal state[2] is logic "1" in a clock cycle, signal state[3] should also be logic "1" in the next immediate clock cycle.

A cone of influence (COI) is defined as a portion of a circuit design capable of affecting signals of a property. Property P has a COI 102 in the circuit design 100 that includes portions of the circuit design 100 capable of structurally affecting the signals of property P. As shown in FIG. 1, the COI 102 includes registers RG[0:3], signals state[0:3], rst, a, clk, and w[0:2], as well as most of the logic elements. The COI 102 of property P includes two registers RG2 and RG3 because these components directly generate the signals state[2] and state[3] that are specified by the property P. The COI 102 also includes components and signals in the fan-in of registers RG2 and RG3, such as the rst and clk signals. The fan-in of each component can be traced backwards to establish the full COI 102 of property P.

Portions of the circuit design 100 that are not in the recursive fan-in of the signals of property P are not within the COI 102. For example, register RG4 is not within the COI 102. This is because register RG4 only generates the state[4] signal that serves as an output of the circuit design and cannot affect the value of the state[2] or state[3] signals.

Property P also has a proof core 104 in the circuit design 100. The proof core 104 is a portion of the COI 102 that is sufficient for proving the correctness of property P during formal verification. As shown in FIG. 1, the proof core 104 for property P includes the buffer w2, the OR gate and the register RG3. The circuitry and signals within the proof core 104 are sufficient for proving the correctness of property P. The circuitry and signals outside of the proof core 104, such as registers RG0 to RG2, and signals state[0] to state[2], are not needed for proving property P. This is because whenever the state[2] signal becomes a logic "1", only the buffer w2, the OR gate, and the register RG3 are needed to guarantee that State[3] is 1 in the next clock cycle. By contrast, the status of the state[0] signal does not affect whether state[3] will change to logic "1" in the next clock cycle and can only affect whether the state[1] signal changes to logic "1" in the next clock cycle.

FIG. 2 is an RTL description 200 of the circuit design of FIG. 1. The RTL description 200 includes several lines of code statements that describe the behavior of the circuit design. When synthesized, the RTL description 200 of FIG. 2 results in the gate-level representation 100 of FIG. 1.

Portions of the RTL description 200 can be traced to their equivalent circuitry from the gate-level representation 100. Statements 009-019 of the RTL description 200 result in the circuitry found inside the COI 102 of the gate-level representation 100. Statements 009-019 thus form the COI 202 at the RTL level. Statements 017-019 of the RTL description 200 result in the circuitry found inside the proof core 104 of the gate-level representation 100. Statements 017-019 thus form the proof core 204 at the RTL level. The RTL-level proof core 204 makes certain assumptions, such as assuming the circuit design is in a post-reset condition so that the reset signal rst can be ignored, and also assuming that the registers will be triggered every cycle so that clock signal clk can be ignored. In other examples, the RTL-level proof core 204 may include a different number of RTL statements.

The COI and the proof core can be used to generate different coverage metrics that indicate a level of formal verification coverage provided by a property. For example, in the case of a proof core coverage metric generation, the coverage metric may be a ratio of code statements that are in the RTL proof core 204 to all of the code statements in the RTL description 200. Reliance upon COI-based coverage metrics alone may overestimate the amount of coverage provided by a property. By narrowing the COI down to a proof core and leveraging the proof core in generating the coverage metric, a proof-core-based coverage metric can more accurately represent how much of the circuit design is actually tested by a particular property P.

Figure 3:
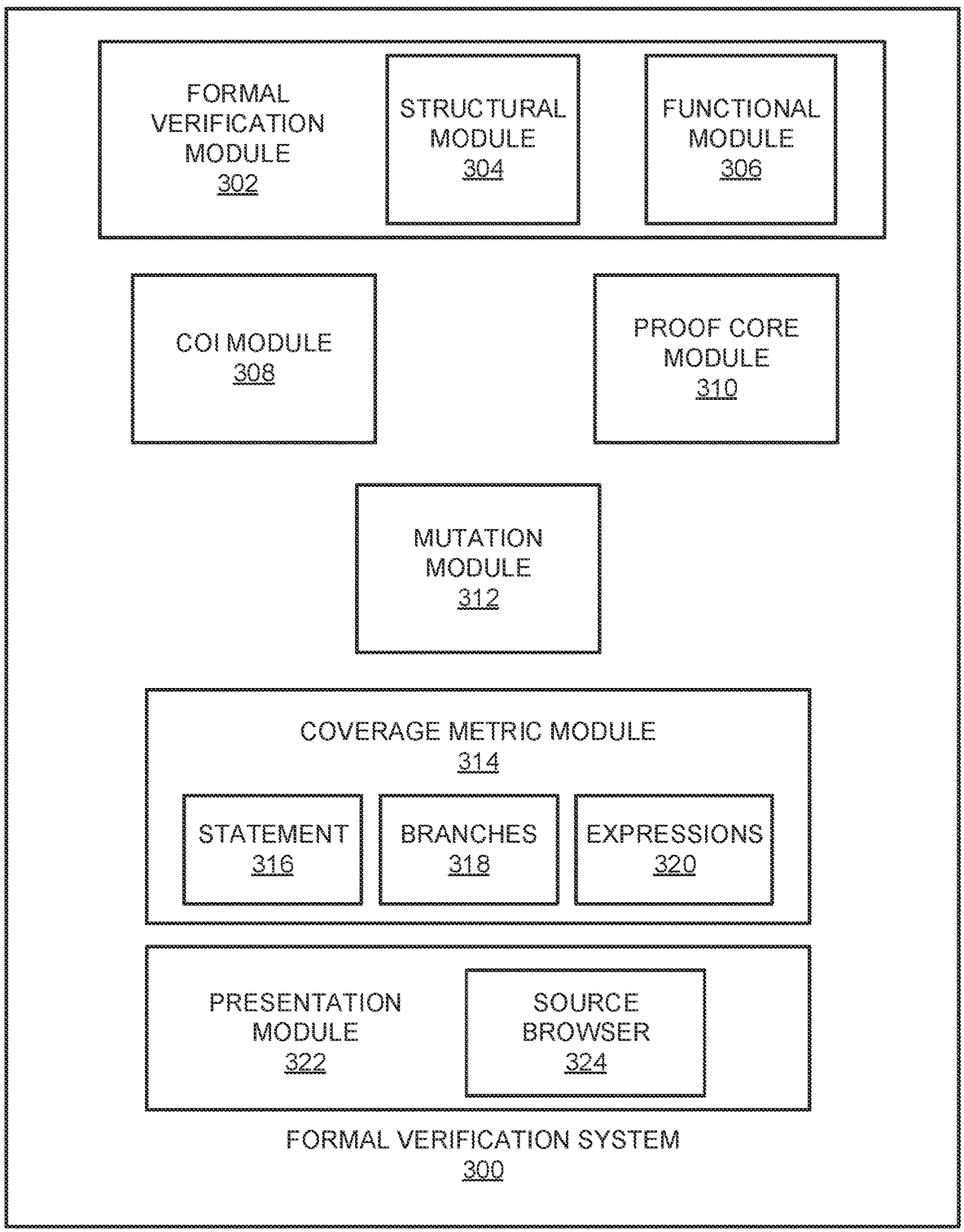
FIG. 3 is a block diagram of an example formal verification system for evaluating formal verification coverage of a circuit design.

FIG. 3 shows a formal verification system 300 for evaluating verification coverage of a circuit design, according to an example. Formal verification system 300 includes a formal verification module 302, which can include one or both of a structural module 304 for performing structural verification and/or a functional module 306 for performing functional verification. Formal verification system 300 can, in various examples, also include one or more of various modules for assisting the various kinds of verification (e.g., a COI module 308, a proof core module 310, and/or a mutation module 312), a coverage metric module 314, and a presentation module 322. In some examples, the verification system 300 is a computer and the modules can be processor-executable software instructions stored on one or more non-transitory computer-readable media of the computer. In other examples, the modules may be implemented in hardware, such as using one or more application-specific integrated circuits (ASICs), one or more field-programmable gate arrays (FPGAs), or similar devices.

Formal verification module 302 performs a formal verification of a circuit design using a set of properties and a set of signal constraints. Formal verification uses mathematical techniques to either prove that, under a set of constraints, each property in the set of properties is always correct or to provide an example condition, called a counterexample, that demonstrates the property is false. The counterexample can be a trace of signal inputs that cause the property to be false. The formal verification module 302 is able, for example, to successfully prove that properties in the set of properties are always correct before providing the properties to the proof core module 310.

The formal verification module 302 can access an RTL description of the circuit design, such as RTL description 200 of circuit design 100, which description may be written in HDL or any other appropriate language. The formal verification module 302 can convert the RTL description into a format that is appropriate for formal verification. The set of properties to be proven during formal verification may, for example, be embedded in the RTL description or stored in a file that is separate from the RTL description. The properties may also be assertions that are described in an assertion-based verification language, such as System Verilog Assertion (SVA) or Property Specification Language (PSL). In various examples, the formal verification module 302 can include one or both of structural module 304, by which a structural verification method (e.g., using COI) may be performed, and/or functional module 306, by which a functional verification method (e.g., mutation, proof core) may be performed.

Structural module 304 may call on COI module 308 to perform structural verification. COI analysis performed by COI module 308 is based on the activation design logic that drives a particular signal. COI coverage suggests that a particular RTL code line is observed by the assertion, as well as all the lines of RTL code that influence this observed line. COI analysis produces conservative metrics that are easier to compute than those provided by functional analysis, such as mutation-based metrics and proof-core-based metrics. However, COI analysis can be less rigorous than functional analysis, in that some of the design logic may be optimized away in various formal engines, and in that it may not always be the case that a line of RTL code is fully verified merely because it is determined to influence another line can be questionable.

Functional module 306 may call on proof core module 310 or mutation module 312 to perform functional verification. For example, the proof core module 310 can identify a proof core 104/204 for the set of properties verified as correct by the formal verification module 302. The proof core 104/204 is a portion of the COI 102/202 that is sufficient for proving the properties to be correct during formal verification. The computation of the proof core 104/204 also accounts for any signal constraints that were applied during formal verification. In one example, the proof core module 310 first identifies a gate-level proof core 104 in the form of a gate level netlist that includes circuit elements and I or signals. The proof core module 310 then identifies an RTL-level proof core 204 from the gate-level proof core 104. More specifically, the proof core 104/204 is computed using a satisfiability (SAT)-based model-checking algorithms using unsatisfiable core generation techniques. One example of such a technique is described in "A Scalable Algorithm for Minimal Unsatisfiable Core Extraction", by Nachu, Dershowitz, Ziyad Hanna, and Alexander Nadel, 36-41 2006 SAT Conference, which is herein incorporated by reference.

A circuit design and property can be synthesized into a gate-level netlist and represented in conjunctive normal form (CNF). Proving the correctness of the property on a design is equivalent to proving that the CNF representation is not satisfiable (UNSAT), which means there do not exist assignments (or values) for the variables (e.g. flip flops and inputs) of the circuit design that makes the property false. It is known that if the CNF representation is UNSAT, there exists a subset of the formula (in CNF format) that is UNSAT too (in the worst case the subset is equal to the entire CNF). Such a subset can be called an UNSAT core, which is sufficient to prove that the property P is true. The proof core module 310 can translate the property P and the circuit design into a gate level netlist, then to CNF. The proof core module 310 can prove that the CNF is UNSAT, and then may compute the UNSAT core.

The proof core module 310 can then lift the UNSAT core to the original circuit design by mapping the variables in the CNF representation to the gate level to identify the UNSAT core at the gate level, and then map the gate level UNSAT core to RTL to identify the UNSAT core at the RTL. This is a book-keeping process that maintains the name correspondence between inputs and registers in the RTL description 200 to the gate-level representation 100 and the CNF variables. The resultant structure of the UNSAT core at the gate level becomes the gate level proof core 104 and the UNSAT core at the RTL description level becomes the RTL description proof core 204.

Additionally or alternatively to proof core analysis, mutation module 312 may be called upon by functional module 306 to perform mutation analysis. Mutation analysis is based on the observation that if a line of RTL code that is covered by an assertion is changed, then the assertion should be triggered. Mutation analysis changes, or "mutates," lines of RTL code one-by-one, testing if such changes trigger testbench checkers or assertions. If all the lines in a design are so mutated one-by-one, then the mutation analysis can arrive at a measure of coverage for the entire design. For example, if 90% of the line changes trigger assertions, then the design can be said to be 90% covered. Although mutation analysis provides high accuracy, it is more computationally expensive than other formal verification methods because of the larger number of times that the verification analysis must be rerun. It will be understood that system 300 need not include both structural and functional analysis capability in all examples, and where system 300 includes functional analysis capability, it need not include both proof core and mutation analysis capability. System 300 may also include other modules, not shown, enabling other types of formal verification analysis.

The coverage metric module 314 generates a coverage metric that indicates a level of formal verification coverage provided by the set of properties that were tested during formal verification. A variety of different coverage models 316, 318, 320 can be used in generating the coverage metric. A coverage model 316, 318, 320 is a set of cover items, where each cover item represents an implicit or explicit event in the circuit design that is to be covered by the circuit design. For a given coverage model 316, 318, 320, an intersection between the cover items in the coverage model 316, 318, 320 and the RTL statements in the RTL proof core 204 is first determined in order to identify those cover items that are within the RTL proof core 204. The coverage can then be computed as a percentage of the cover items that are found within the RTL proof core 204 relative to all of the cover items in the coverage model. For example, the coverage metric can be computed to be "40% coverage." Higher coverage metrics indicate a better level of coverage, whereas lower coverage metrics indicate a lower level of coverage. The coverage can also be computed in other ways that represent a relationship between the subset of cover items that are covered by the RTL proof core 204 and all of the cover items. For example, the coverage metric can be a ratio of "⁹⁄₁₀ cover items met."

Three different types of coverage models 316, 318, 320 are shown in FIG. 3: a statement coverage model 316, a branch coverage model 318, and an expression coverage model 320. In other examples, other coverage models are also possible even though not shown in FIG. 3. The coverage metric module 314 can select from any of the coverage models 316, 318, 320 when generating the coverage metrics.

Statement coverage model 316 can include cover items in the form of one or more of the code statements in the RTL representation 200 of the circuit design. When statement coverage model 316 is used, the coverage metric module 314 generates a statement coverage metric that represents a level of statement coverage provided by the RTL proof core 204. Different variations of statement coverage models 316 are possible. Some statement coverage models 316 only include assignment statements from the RTL representation 200. Referring to FIG. 2, assignment statements are found in lines 012, 015, 017, 018, 019, and 021 for a total of six assignment statements. An assignment coverage metric generated for the proof core 204 would thus be "⅗" assignment statements covered. Other statement coverage models 316 may include all of the statements in the RTL representation 200. Branch coverage model 318 can include all of the branches in the RTL description 200 of the circuit design. When branch coverage model 318 is used, the coverage metric module 314 generates a branch coverage metric that represents a level of branch coverage provided by the RTL proof core 204. For example, the branch coverage metric can be a percentage of code branches found within the RTL proof core 204 relative to all code branches within the RTL description 200.

Expression coverage model 320 can include expression cover items for logic expressions and sub-expressions in the RTL description 200 of the circuit design. Expression coverage model 320 can be used to identify logic expressions and subexpressions in the design and to create expression cover items for each expression. For example, in an expression of the form A & B, there are three cover items: ~A & B, A & ~B and A & B. The cover items are then used to generate an expression coverage metric that represents a level of expression coverage provided by the RTL-level proof core 204. For example, the branch coverage metric can be a percentage of the expression cover items found within the RTL-level proof core 204.

The presentation module 322 presents the coverage metric in a display so that the coverage metric can be viewed by a circuit designer or verification engineer. The circuit designer or verification engineer can then evaluate whether the amount of coverage provided by the tested properties is sufficient. If the coverage is not sufficient, the circuit designer or verification engineer may add additional properties, that is, may write new checkers, to increase the level of coverage and then re-run the verification process to update the coverage metric.

Presentation module 322, may, for example, include software-implemented methods for rendering a user-interactive source browser configured for graphical display of coverage as an annotated RTL description listing. As an example, portions (e.g., blocks, lines, or statements) of an RTL description listing that have been covered by formal verification (e.g., by execution of the formal verification module 302 and other associated modules) may be displayed to the circuit designer or verification engineer as visually distinct from those that have not been covered by formal verification, which portions may be referred to as "checker coverage holes," or just "holes." As one example, RTL description portions that have been covered by formal verification may be displayed as highlighted green, whereas holes may be left unhighlighted, or highlighted gray.

Noting that the RTL description as displayed is insufficiently green-highlighted (for example), the circuit designer or verification engineer may then iteratively add additional properties (that is, may write new checkers) and re-execute formal verification until the circuit designer or verification engineer is satisfied with the amount of coverage achieved. As an example, the circuit designer or verification engineer may iteratively write checkers and re-execute one or more structural formal verification processes until there are no checker coverage holes for the portions of the RTL description of interest (e.g., until the RTL description is 100% green-highlighted), after which the circuit designer or verification engineer may repeat the process with one or more functional formal verification processes. Functional formal verification processes are usually more rigorous, and more computationally expensive, than structural formal verification processes. Accordingly, functional formal verification processes generally take longer time to complete and are more likely to discover checker completeness holes, even in code that has been fully cleared of checker completeness holes by structural formal verification processes. Thus, a circuit designer or verification engineer will generally opt to run a functional formal verification process only after holes are completely eliminated within portions of interest of an RTL description by a structural formal verification process. It will be appreciated that the examples given of green and gray highlighting to visually distinguish verified checker coverage and checker coverage holes in a displayed listing of RTL code are only one way of graphically depicting such indications. Various other forms of highlighting, font adjustment (e.g., boldfacing, italicizing, underlining, typeface adjusting), outlining, flagging, or other types of annotating may be used to similar effect.

In practice, the RTL description for a design undergoing formal verification may comprise many hundreds, thousands, tens of thousands, hundreds of thousands, or even millions of lines of RTL code. The amount of data returned by the formal verification system 200 may be voluminous and the resultant RTL description annotations (e.g., highlighting) may be confusing, with many holes that could take a circuit designer or verification engineer a long time to review and comprehend to the extent needed to determine a minimum set of points of the RTL code representative of the entire incompleteness. A verification engineer may write one or more checkers designed to address specific sufficient points of the annotated RTL code to reach 100% completeness. This type of manual completeness-seeking process involving writing more checkers and repeating formal verification execution can be highly iterative, duplicative, imprecise, and time-consumptive.

Figure 4:
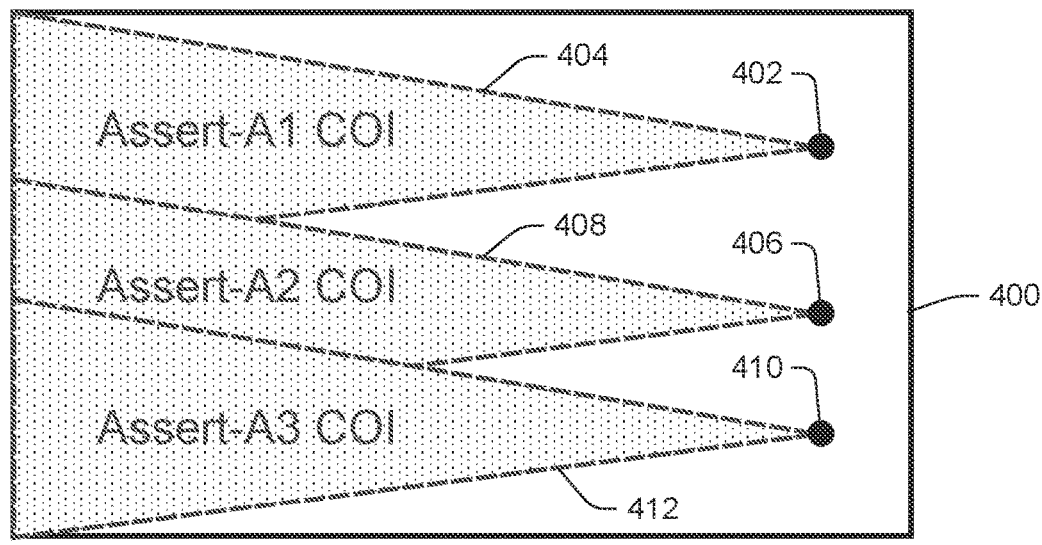
FIG. 4 is a diagram of an example design having three cones of influence, in a structural checker completeness approach.
Figure 5:
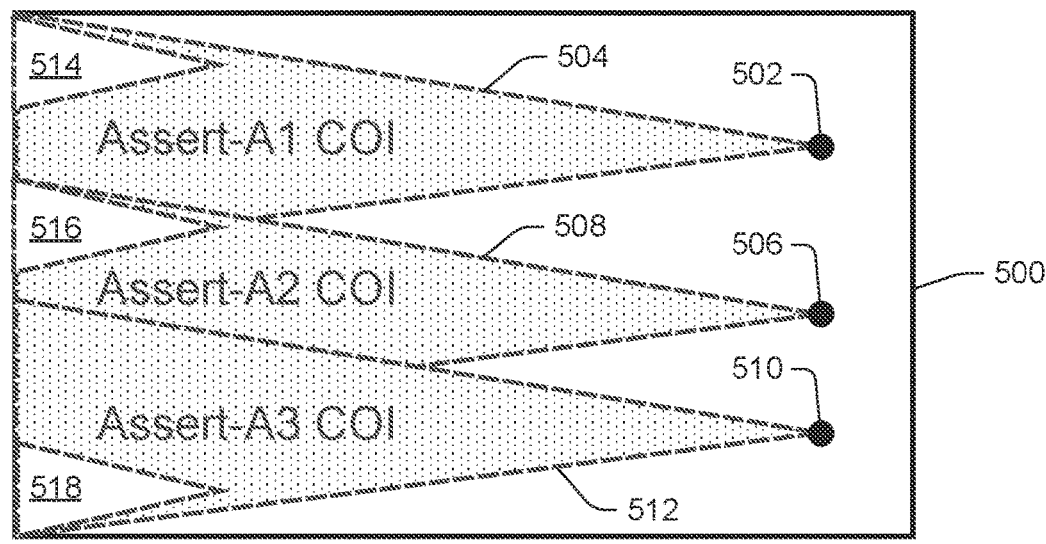
FIG. 5 is a diagram of an example design having three cones of influence, in a functional checker completeness approach.

FIGS. 4 and 5 respectively illustrate structural and functional checker completeness approaches as diagrams representing circuit designs. As discussed above, formal verification analysis tools can address the problem of checker completeness either structurally or functionally. Structural approaches include COI analysis, and are based on evaluating fan-in of user-written checkers (assertions or properties) on a DUT. The output is modeled using cover items extracted from the DUT that are not covered structurally by any property. FIG. 4 shows three properties, or asserts, A1, A2, A3, respectively represented, within the DUT represented by box 400, as points 402, 406, and 410 at the tips of respective cones of influence 404, 408, 412. DUT 400 has properties written on some of the signals of DUT 400. A portion of DUT 400 is not within any of the three illustrated COIs. An example of a property, or assert, that may be written for the DUT 400 illustrated in FIG. 4 is the following line of RTL code:

A1 Assert (stack_full|→~new_entry)

where "stack_full" and "new_entry" are two signals on which assert A1 402 is written. The meaning of this assert may be described as "if the stack is full, no new entry will be allowed." When structural analysis examines assertion A1 402 in DUT 400, it traverses the structural fan-in with regard to these two signals, stack_full and new_entry, thereby defining COI 404. As can be seen in FIG. 4, each COI 404, 408, 412 for each respective assert may have a unique portion not shared with other COIs, and also may have one or more overlapping portions shared with other COIs.

FIG. 5, relating to functional checker completeness approaches, also shows three properties, or asserts, A1, A2, A3, respectively represented, within the DUT represented by box 500, as points 502, 506, and 510 at the tips of respective cones of influence 504, 508, 512. As contrasted with the structural approach illustrated in FIG. 4, the portion of DUT 500 not within any of the three illustrated COIs 504, 508, 512 includes notches 514, 516, 518. The boundaries of notches 514, 516, 518 represent end points to the respective COIs 504, 508, 512 that are provided by functional data from model-checking engines used to perform functional formal verification analysis.

Whatever the mode of checker completeness used, whether structural or functional, the same type of data may be reported out, such as lists including one or more cover items. Cover items may be, for example, block-level items or statement-level items. The result reporting may thus be independent of the type of checker approach used, whether, for example, proof core or mutation for a functional approach or COI-based for a structural approach.

FIG. 6A is an example annotated RTL listing 600 as may be displayed in a source browser and is representative of a result output that may be produced by a model checker, executed using structural analysis, showing coverage and holes as visually distinct portions of the RTL listing. (The design represented in the example illustrated annotated RTL listing 600 is unrelated to the design represented by listing 200 of FIG. 2 or the schematic 100 of FIG. 1.) In the example design listing 600, a checker 602 is written on signal out1. Following structural analysis, design portion 604 is covered by checker 602 and may therefore be rendered as visually distinct from the remainder of the design 600. This remainder constitutes one or more holes 606, signals out2 and out3 not being covered by checker 602. Accordingly, covered portion 604 may, as one example, be rendered as green-highlighted text, whereas holes 606 may be rendered as gray-highlighted text, but, as discussed above, visual distinction between covered portions and holes may be achieved in a variety of ways. A formal coverage tool may report analysis results at the cover item level, and the listing 600 may be rendered with visual distinctions between covered portions and holes accordingly.

Upon receiving such a results report as the one given at least in part in the form of annotated listing 600, a user may write additional checkers and/or revise previously written checkers to enhance coverage. To do so, a user may have to manually read a coverage hole report, and/or manually traverse a corresponding design schematic, to discover signals on which to on which one or more checkers should be written or rewritten to achieve the desired enhanced coverage (e.g., 100% coverage). When covered portion 604 represents less than the entire portion of interest of listing 600, the current set of checkers has only covered a subset of the design signals, and the user may modify one or more checkers, or write new checkers, to cover additional signals until all relevant portions of the design are covered.

Having to manually page through an annotated RTL listing displayed in a source browser to write or rewrite checkers to cover a greater portion of the design, and, desirably, the entirety of the relevant portion of the design so as to cover all holes, may pose difficulty. For example, in a result scenario where there is very large set of holes, a large portion of the RTL code may be rendered in gray (for example). To write or rewrite checkers on design signals to cover holes, a user may have to laboriously review an annotated RTL listing and/or a reporting log to note relevant signals on which to write checkers, may have to consider various combinations of signals on which checkers may be written, and then may have to devise a refined set of checkers or a new set of checkers, all of which is manual work. In the example of FIG. 6A, which has only one checker, checker 602 for property Prop1, for example, a user may write additional checkers as Prop2, Prop3, etc., and/or may modify the first checker 602.

In performing this manual task, a user may note that hole portion 606 contains a variety of signal names (out2, in1, in3, etc., in the example of FIG. 6A). In practice, with much longer RTL listings, the list of signal names in a hole portion may comprise many hundreds or many thousands of signals. Structural-analysis-based methods and systems as described herein can traverse cones of influence and identify one or more common signals that are driven by that a larger group of signals to automatedly group such signals and return for the user which one signal, or subset of such signals, would cover all of the others, should one or more checkers be written to cover the one signal or subset of signals. In the example of FIG. 6A, if a checker were to be written for signal out3, a re-execution of the verification analysis could cause the entire gray portion 606 to subsequently turn green (for example), indicating that all holes have been covered. An automated grouping, reduction, and ranking of signals on which to write checkers can greatly reduce the work of checker writing for the user and more quickly result in the desired level of coverage.

FIG. 6B shows the annotated RTL listing 600 of FIG. 6A but with cover item labels marked on the listing to indicate the relationship between RTL statements and cover items. For example, a label covitm1 for a first cover item indicates the statement out1<=2'b00; a label covitm2 for a second cover item indicates the statement out1<=2'b01; and so on, down to eighth cover item label covitm8 for the statement out3<=out2||out1. Presentation module 322 can make these labels visible to the user in the source browser 324, either substantially as shown in the illustrated example or with other placement or display features. Each labeled cover item is an entity that is automatically identified from the design. Cover items can be on the level of branches, statements, expressions, toggle signals, or finite state machines; a cover item label can refer to a block of the RTL code, a single line of the RTL code, or an individual signal. In the illustrated example, each cover item label refers to a statement. Whereas in conventional reporting, an associated report might read:

Out-report: {covitm4, covitm5, covitm6, covitm7, covitm8, covitm9} in a report generated by the methods and systems described herein, the report could read:

Out-report-New:
{{out3 {covitm4, covitm5, covitm6 covitm7, covitm8}}
{out2 {covitm4, covitm5, covitm6}}}

Whereas, in the conventional out-report, only cover items are reported, in out-report-new, a user can observe signals out2 and out3 associated with their respective related cover items: signal out3 is associated with cover items 4, 5, 6, 7, and 8, and signal out2 is associated only with cover items 4, 5, and 6. Additionally, in the reporting, these signals may be reported as ordered by a ranking, based on heavy cone, to assist the user to focus primarily on signals having a larger impact on coverage. Thus, signal out3 can be listed above signal out2 in out-report-new because a checker written on signal out3 will cover a larger portion of the holes. In the illustrated example, a checker written on signal out3 will cover all holes 606, because it will cover all cover items covitm4, covitm5, covitm6, covitm7, covitm8 labeled within uncovered portion 606 of RTL listing 600. Thus, writing a checker on signal out3 obviates the need to write a checker on signal out2. In an example workflow, having received the reporting indicating signals ordered by priority, a user may choose the top signal to write a checker on, and then re-run the formal verification analysis before choosing another signal to write another checker on, if necessary. Nevertheless, lower-priority signals can be included, and not omitted, from the reporting, to permit flexibility of choice to a human, because some signals, such as output-port signals, may be more useful for writing checkers on.

FIG. 6C is an example annotated RTL listing 650 as may be displayed in a source browser and is representative of a result output that may be produced by a model checker, executed using functional analysis, showing coverage and holes as visually distinct portions of the RTL listing. As with the previous example 600 of FIG. 6A, in the example design listing 650, a checker 652 is written on signal out1. Following functional analysis, design portion 654 is covered by checker 652 and may therefore be rendered as visually distinct from the remainder of the design 650. This remainder constitutes one or more holes 656, signals out2 and out3 not being covered by checker 652. Accordingly, covered portion 654 may, as one example, be rendered as green-highlighted text, whereas holes 656 may be rendered as gray-highlighted text, but, as discussed above, visual distinction between covered portions and holes may be achieved in a variety of ways. A formal coverage tool may report analysis results at the cover item level, and the listing 650 may be rendered with visual distinctions between covered portions and holes accordingly. FIG. 6D shows the annotated RTL listing 650 of FIG. 6C but with cover item labels marked on the listing to indicate the relationship between RTL statements and cover items.

Upon receiving such a results report as the one given at least in part in the form of annotated listing 650, a user may write additional checkers and/or revise previously written checkers to enhance coverage, but, as described above, to do so, a user may have to manually read a coverage hole report, and/or manually traverse a corresponding design schematic, to discover signals on which to on which one or more checkers should be written or rewritten to achieve the desired enhanced coverage (e.g., 100% coverage). As described above, there may be difficulties associated with having to manually page through an annotated RTL listing displayed in a source browser to write or rewrite checkers to cover a greater portion of the design, and, desirably, the entirety of the relevant portion of the design so as to cover all holes, may pose difficulty. An automated grouping, reduction, and ranking of signals on which to write checkers can greatly reduce the work of checker writing for the user and more quickly result in the desired level of coverage. As with the structural analysis example of FIGS. 6A and 6B, in the functional analysis example of FIGS. 6C and 6D, a report generated by the methods and systems described herein, the report could read:

Out-report-New:
{{out3 {covitm4, covitm5, covitm6 covitm7, covitm8}}
{out2 {covitm4, covitm5, covitm6}}}

Having received the reporting indicating signals ordered by priority, a user may choose the top signal to write a checker on, and then re-run the formal verification analysis before choosing another signal to write another checker on, if necessary.

Figure 8:
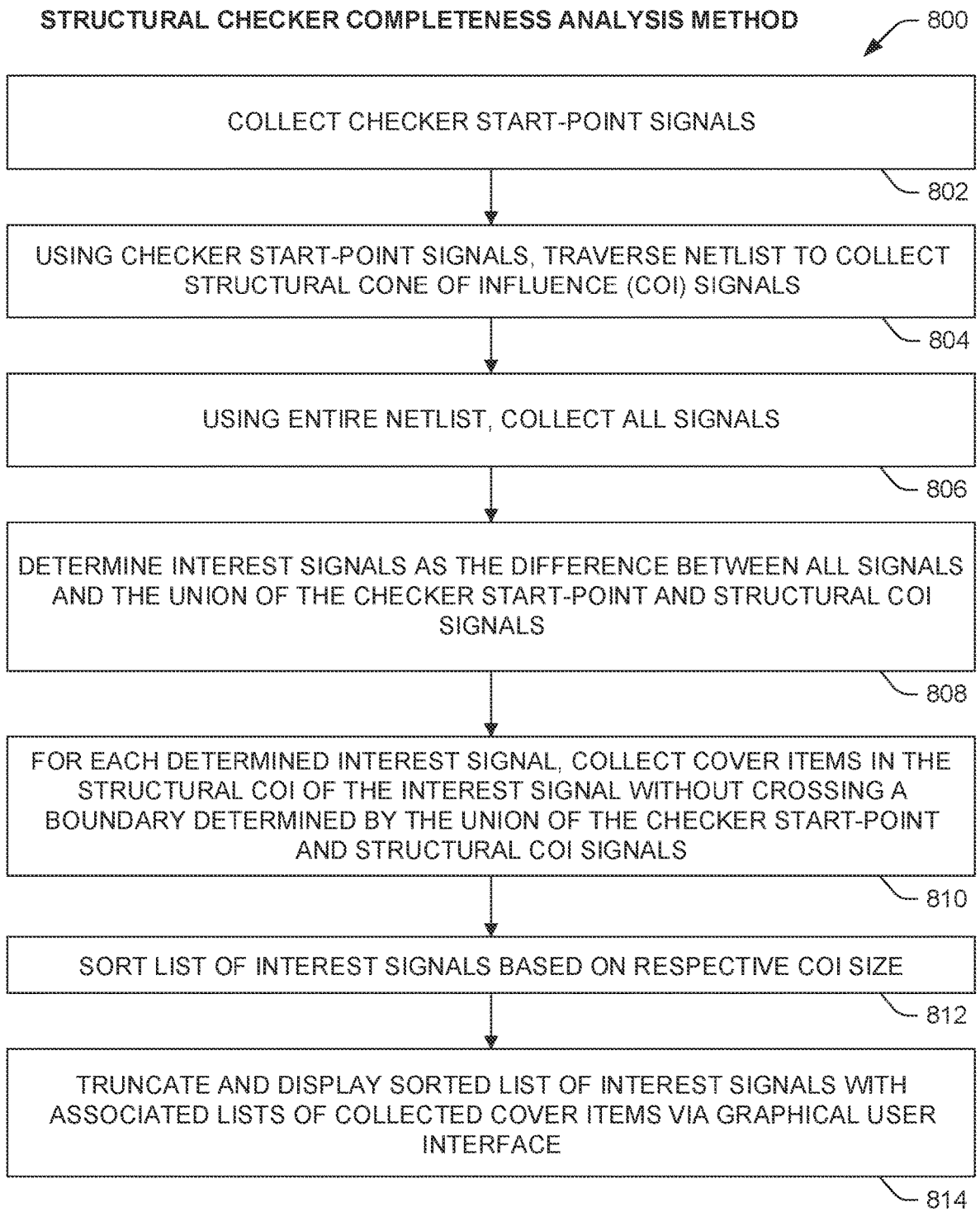
FIG. 8 is a flow diagram of an example structural checker completeness analysis method.
Figure 9:
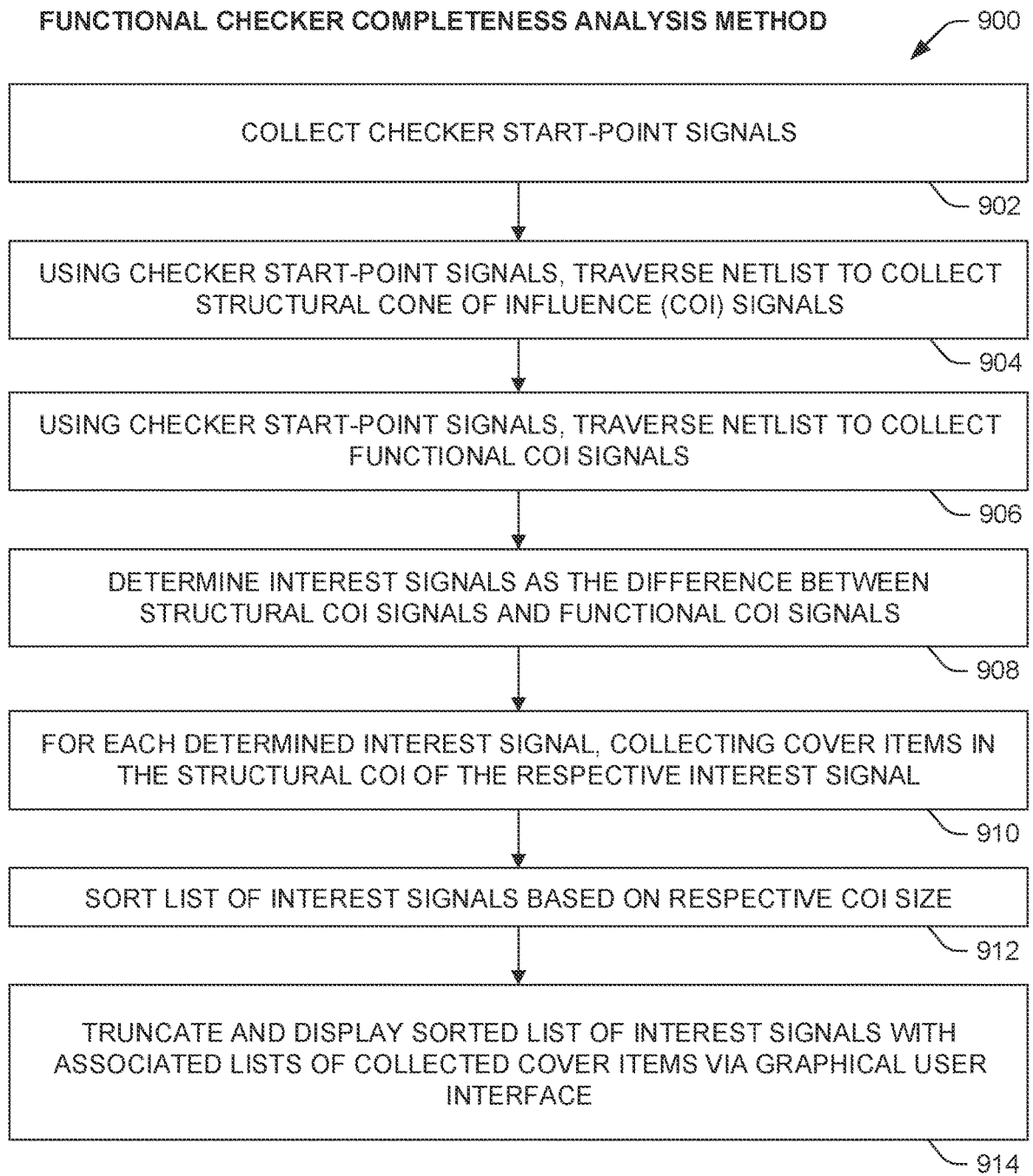
FIG. 9 is a flow diagram of an example functional checker completeness analysis method.

Although for some examples, such as the simple examples illustrated in FIGS. 6A-6D, there may be no difference in displayed output from the reporting-level user perspective as between structural and functional checker completeness analysis, the underlying structural and functional methods are different, as illustrated by FIGS. 8 and 9.

Structural and functional analyses also pose an accuracy versus runtime tradeoff: COI-based (structural) analysis methods are fastest but not the most accurate. Functional analysis methods are more accurate, but take more time to complete. Accordingly, a user may start by iteratively running a structural method, writing and/or revising checkers until 100% coverage is achieved for the design portions of interest, and only then will the user repeat the iterative process for more rigorous modes of checker completeness.

Figure 7:
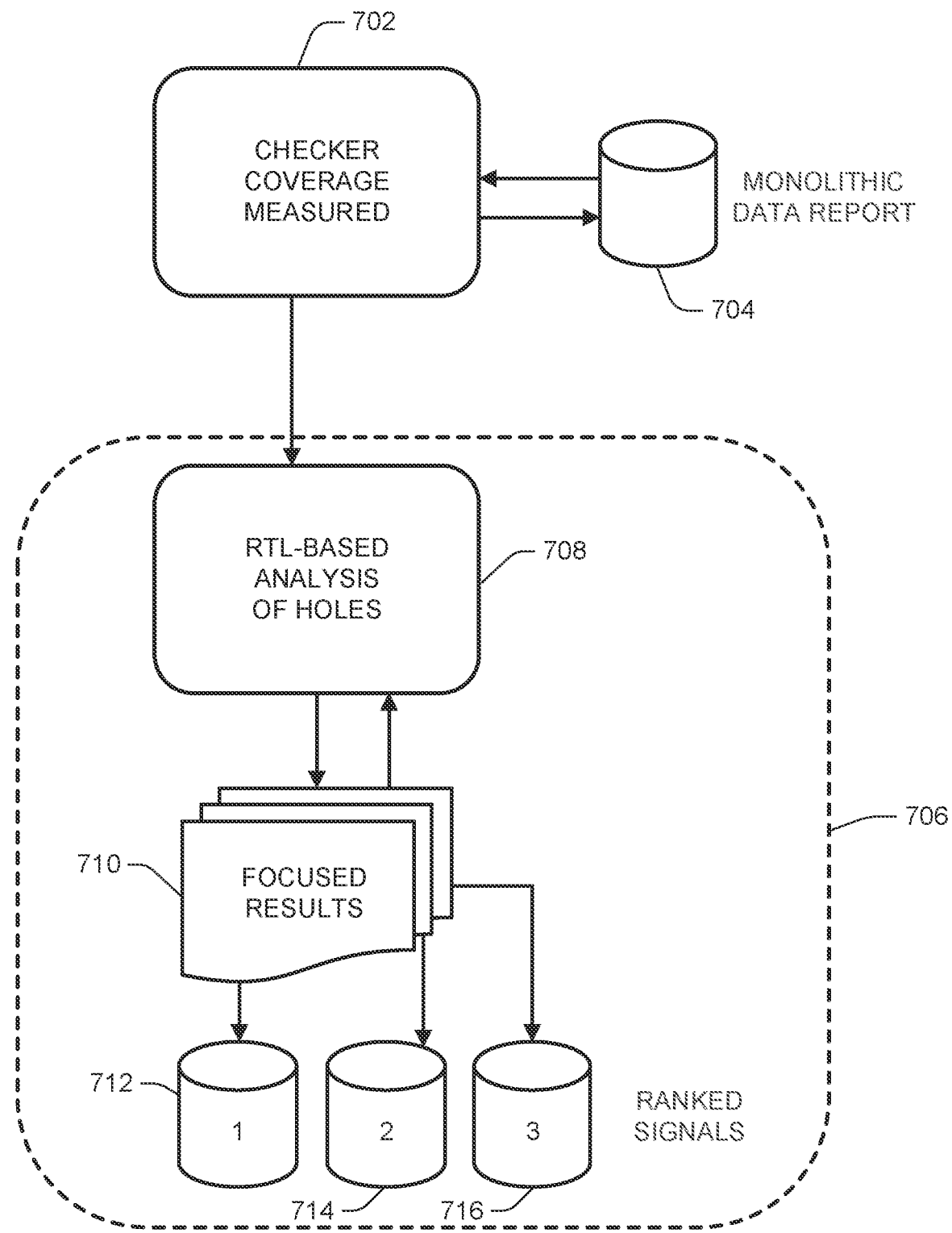
FIG. 7 is a block diagram of an example method of providing concise data for analyzing checker completeness.

The diagram of FIG. 7 shows the relationship between the systems and methods of the present application, indicated by outline 706, and conventional reporting 704, which is generally provided as a monolithic data report output from conventional checker coverage quantification systems or methods 702, which report can be difficult for a circuit designer or verification engineer to interpret so as to efficiently obtain full coverage of a design. The present systems and methods provide RTL-based analysis 708 of holes and deliver focused results 710 in the form of interest signals 712, 714, 716 that can be ranked with respect to each other such that a user can quickly select, for example, the top-ranked signal 712 on which to write a new checker and proceed with the formal verification analysis process. Focused results 710 can also include respective lists of cover items associated with each of the respective interest signals. A reported list of interest signals 712, 714, 716 can be limited, e.g., to the top three sorted interest signals, or to the top ten sorted interest signals. As described above, each interest signal can be reported along with cover items that correspond to each interest signal.

FIG. 8 is a flow chart illustrating a structural method 800 of checker completeness analysis. The method 800 will be explained with reference to FIGS. 4, 6A, and 6B. As a basis for the method 800, it will be understood that a circuit design undergoing formal verification analysis will be described by an RTL listing from which a netlist may be generated, and that the RTL listing will have one or more checkers, each written on one or more signals. First, checkers in the RTL listing are examined and checker start-point signals are collected 802 from these checkers. Thus, for example, in the RTL listing of FIG. 6A, the sole checker 602, called Prop1, is examined and the single signal in that checker is extracted, which signal is out1. In an example with more checkers and more signals, a larger list of signals would be extracted and collected 802 as the list of start-point signals.

Next, using the collected list of checker start-point signals, the entire netlist, as generated from the RTL listing, is traversed 804 to collect structural COI signals. For example, with reference to FIG. 4, if the checker start-point signal is located at point 402, the netlist can be traversed back from point 402 to determine a COI 404 and to collect all signals within the COI 404, that is, all signals in the fan-in of starting signal at point 402 in the design 400. This traversal process is recursive in nature, in that it starts from a signal and keeps traversing the netlist until the traversal hits the inputs of the design (e.g., at the left side of box 400), which are the boundary of the design and do not have any fan-in. As an example, in the design represented by the RTL listing 600 of FIG. 6A, the netlist traversal 804 will collect signals out2 and out3, and then also signals rst and clk. The respective fan-ins of these collected signals in turn will themselves be traversed because the cones of influence of each of these signals contribute to the cone of influence of start-point signal out1. Thus, signals in1 and in3 are also included and in the collected list of structural COI signals, both of these signals being in the fan-in of out2, and the respective fan-ins of in2 and in3 will be traversed as well.

The traversed cone of influence for starting signal out1 thus collects every signal that has a direct or indirect influence on that signal. Traversal 804 is performed by doing a structural analysis on a netlist to obtain signals. Separately from traversal 804, the collection of all signals present in the design 806 is listed. For example, the list can be collected from the design representation in a database populated during design compilation, such as when the text-based RTL description is converted in memory into a data structure that represents the circuit. Collection 806 can be performed before, after, or in parallel with collection 804. Then, a logical set subtraction is performed between the signal-list results of collection 806 and the signal-list results of collection 804, including the checker start-point signals, to determine 808 a set of interest signals—those signals in the design that are outside the COI of the start-point signals. In the example diagram of FIG. 4, the interest signals are those within the design 400 but which lie outside of cones 404, 408, 412, which region of the design 400 can be referred to as the uncovered region. The determined 808 signals of interest are those that will form part of the structural analysis output report. Before reporting, the signals of interest can be associated with corresponding cover items (blocks, lines, or statements of the RTL listing) and can be ranked so that a concise, useful output report can be generated and presented to user (e.g., by presentation module 322 of system 300 of FIG. 3).

After determining 808 the interest signals, for each interest signal, the COI netlist traversal process is performed, just as in the structural analysis used to perform collections 804 and 806, but this time to collect 810 cover items in the structural COI for each interest signal without crossing a boundary (within the netlist) determined by the union of the checker start-point signals (collected in 802) and the structural COI signals (collected in 804). In other words, with reference to the example diagram of FIG. 4, the traversal performed in collection 810 does not enter any regions 404, 408, 412 of the design 400 that are covered by the checker start-point signals or those signals within their respective cones of influence, since those regions are already covered by at least one checker. As mentioned above, cover items may be statement-level, branch-level, or expression-level. Cover item 4 in FIG. 6B is the non-blocking statement out2<=2'b00. Cover item 4 can be automatically extracted from the netlist derived from the RTL listing 600. Cover item 4 is only executed when reset signal rst is high under the clock edge specified in line 010 of the RTL listing. By contrast, cover item 5 in FIG. 6B is only covered when the else-if condition of line 013 is true, which is when reset signal rst is false AND both bits in1 and in3 are 0.

The interest signals within the uncovered region will each have a respective COI, and each respective COI can be quantified by size, for example, by the number of cover items within the respective COI, or the number of distinct signals within the respective COI. The sorting can be done by a simple count or by a weighted count, where the weighting of each cover item may be based on distance from other cover items in the design, such that cover items less likely to be intermingled with other cover items are weighted more heavily in ranking the interest signals. The interest signals can be sorted 812, or ranked, by COI size. The interest signals so determined 808 can be reported along with their associated cover items so collected 810 and as so sorted 812. The reported list of interest signals can be limited, e.g., to the top three sorted interest signals, or to the top ten sorted interest signals. For example, the sorted list of interest signals can be truncated and displayed 814, along with associated lists of collected cover items, via a graphical user interface, as may be provided by presentation module 322 in system 300 of FIG. 3.

FIG. 9 is a flow chart illustrating a functional method 900 of checker completeness analysis. The method 900 will be explained with reference to FIGS. 4, 6A, and 6B. As a basis for the method 900, it will be understood that a circuit design undergoing formal verification analysis will be described by an RTL listing from which a netlist may be generated, and that the RTL listing will have one or more checkers, each written on one or more signals. First, checkers in the RTL listing are examined and checker start-point signals are collected 902 from these checkers. Next, using the collected list of checker start-point signals, the entire netlist, as generated from the RTL listing, is traversed 904 to collect structural COI signals. The collection of checker start-point signals 902 and structural COI signals 904 are identical to collection 802 and collection 804 of structural method 800 of FIG. 8 and need not be repeated if structural checker completeness analysis method 800 has already been executed. Separately from traversal 904, the netlist is traversed starting from the checker start-point signals to collect 906 functional COI signals. In practice, the execution of one or formal model-checking engine to perform functional analysis provides data in terms of RTL signals reflecting what portions of the design are able to be exercised and what portions of the design are not able to be exercised when a property is proven. Thus, the functional COI signals may be derived from execution of the model-checking engines during functional verification.

In this functional analysis method 900, the boundaries are not defined by the primary input, but instead are defined by the functional COI signal data given by the executed model-checking engine. With reference to FIG. 6B, wherein Prop1 is the property, or the checker, written on signal out1, the result of formal verification model-checking engine execution may be the green-highlighting (for example) of RTL code portion 604 as the only portion of the listing 600 needed to prove property Prop1 because of the nature of the property. Only the three statements labeled covitm1, covitm2, and covitm3 in covered portion 604 are exercised; the other statements in hole portion 606 are not exercised by property Prop1, and are therefore highlighted in gray (for example) as a coverage hole for functional analysis. Starting from signal out1 on which Prop1 is written, the boundary nets are given by functional metadata, and completely cover signal out1, but do not extend beyond boundary signals out2 and out3. The collection 906 of functional COI signals is thus accomplished by a netlist traversal starting from the checker starting point, and stops on the boundaries given by the functional metadata. Thus, whereas in the structural traversal the end points were the primary input, in the functional traversal the end points are provided by functional data from the model-checking engines.

Collection 906 can be performed before, after, or in parallel with collection 904. Then, a logical set subtraction is performed between the signal-list results of collection 904 and the signal-list results of collection 906 to determine 908 a set of interest signals. In the example diagram of FIG. 5, the interest signals are those within the design 500 but which lie outside of cones 504, 508, 512, which region of the design 500 can be referred to as the uncovered region. In the example of FIG. 5, the uncovered region includes notch regions 514, 516, 518. The determined 908 signals of interest are those that will form part of the functional analysis output report. Before reporting, the signals of interest can be associated with corresponding cover items (blocks, lines, or statements of the RTL listing) and can be ranked so that a concise, useful output report can be generated and presented to user (e.g., by presentation module 322 of system 300 of FIG. 3).

After determining 908 the interest signals, for each interest signal, the COI netlist traversal process is performed to collect 910 cover items in the structural COI for each interest signal. This part of the process 900 can be identical to collection 810 in method 800. Also as in method 800, the signal list result of functional checker completeness analysis method 900 can be sorted 912, e.g., based on COI size of each signal, whether weighted (as, for example, by relative COI distances) or unweighted. The sorted signal list can then be reported to the user, e.g., by presentation module 322 of system 300 in FIG. 3. The reported list of interest signals can be limited, e.g., to the top three sorted interest signals, or to the top ten sorted interest signals. For example, the sorted list of interest signals can be truncated and displayed 914, along with associated lists of collected cover items, via a graphical user interface, as may be provided by presentation module 322 in system 300 of FIG. 3.

For achieving signoff, it may be required that 100% of relevant portions of the design are covered by formal verification. However, some portions of the design may be deemed irrelevant and may be excluded from checking and/or reporting. For this reason, system 300 can include the capability to disable analysis one or more cover items via a user interface such that the disabled cover items are disincluded in the formal verification analysis and/or reporting, and/or to indicate to users that there is no need to write one or more checkers for them. As an example, disincluded cover items can be dropped from the cover items that can be collected in the collections 810 or 910.

Figure 10:
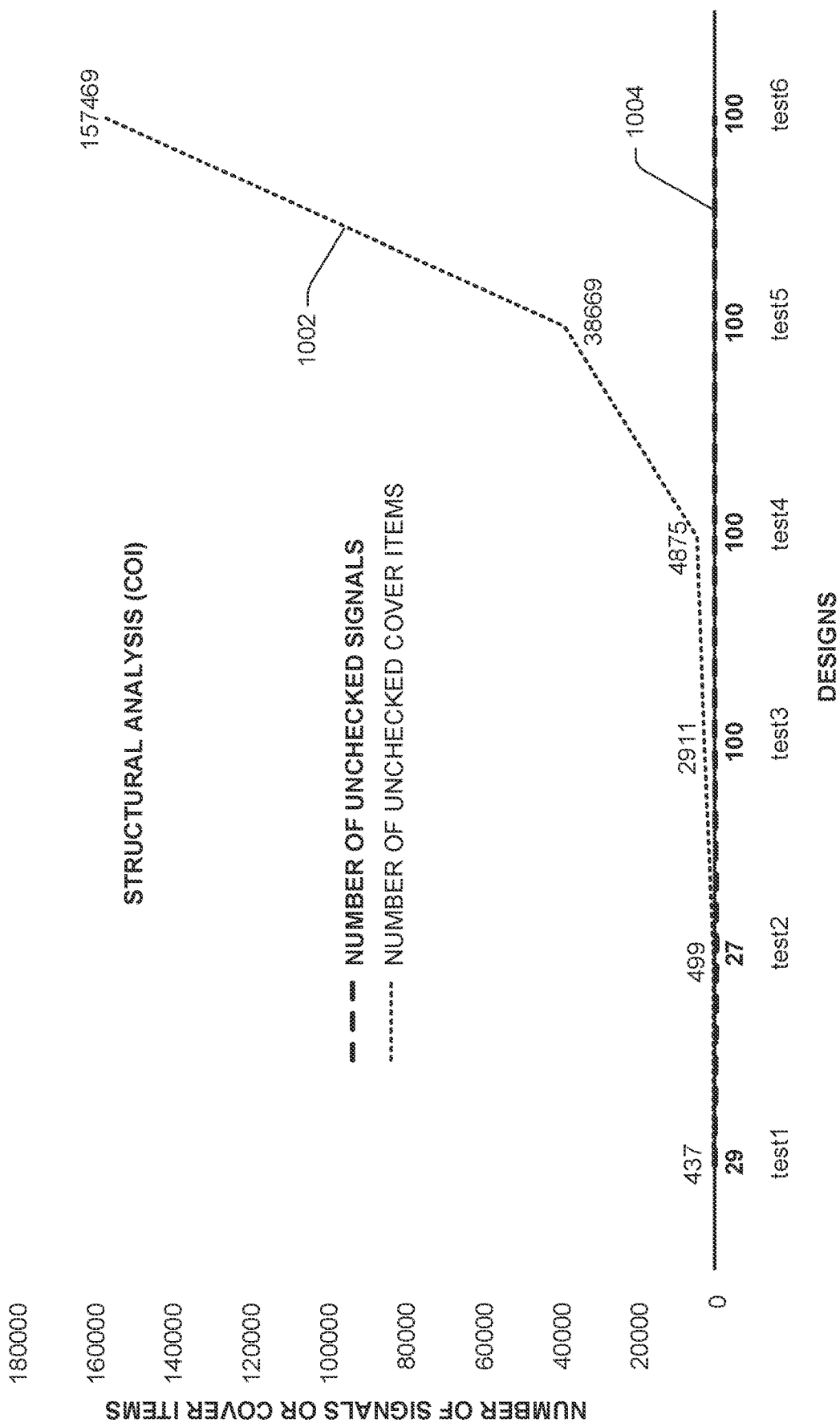
FIG. 10 is an example graph illustrating advantages of the checker completeness reporting provided by the systems and methods described herein as compared to prior systems and methods for structural formal verification analysis.
Figure 11:
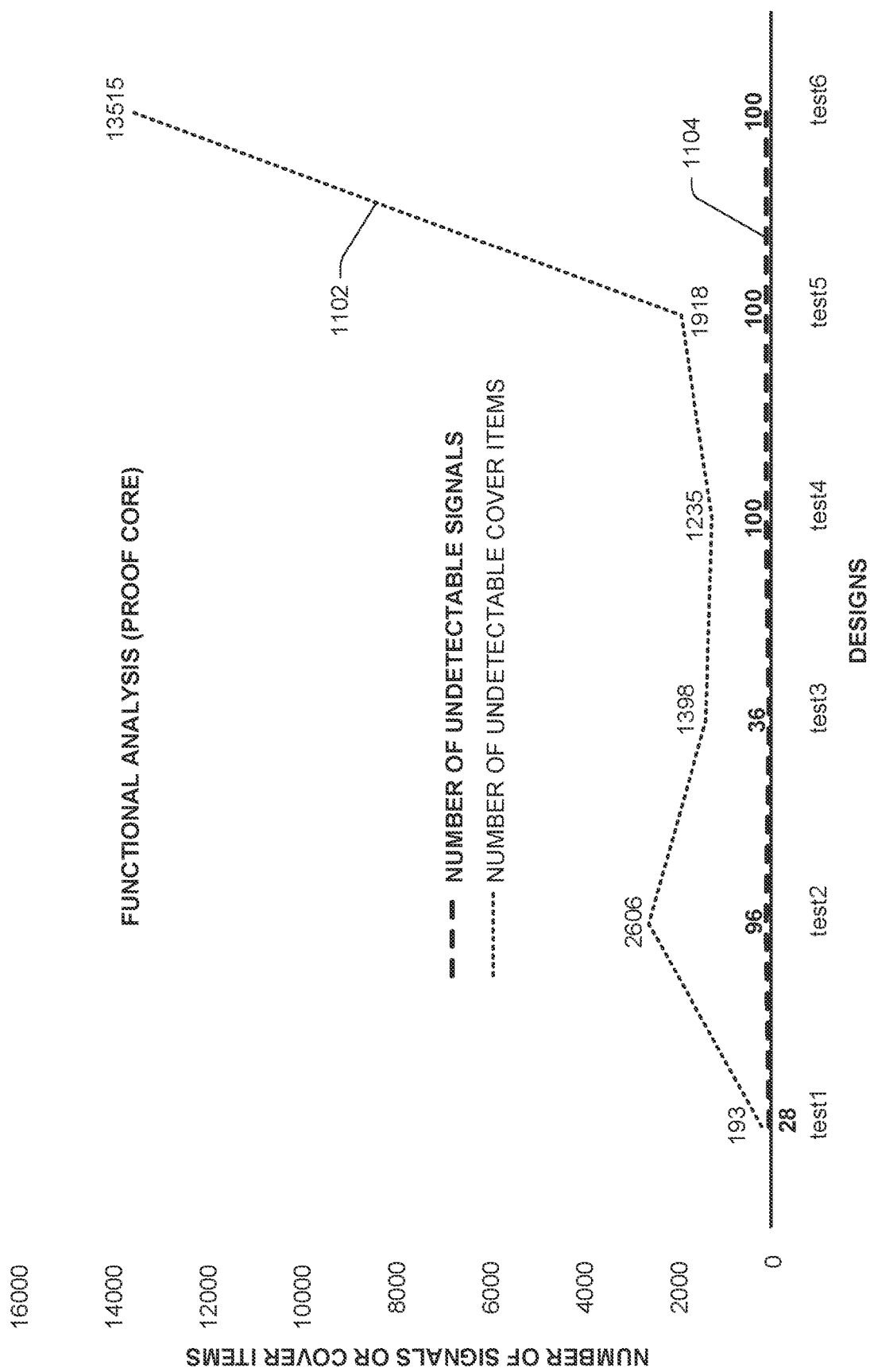
FIG. 11 is an example graph illustrating advantages of the checker completeness reporting provided by the systems and methods described herein as compared to prior systems and methods for functional formal verification analysis.

The graphs of FIGS. 10 and 11 illustrate, for structural and functional formal verification analysis methods, respectively, that for large sets of designs the systems and methods of the present application are able to provide a very small set of signals which are a good candidate for checker completeness closure. In each of FIGS. 10 and 11, for each of six different tests (horizontal axis), the number of unchecked signals or cover items (vertical axis) is plotted.

Plot 1002 in FIG. 10 relates the number of cover items reported by conventional reporting methods for each of six designs. Plot 1004, which is almost indistinguishable from the horizontal axis of FIG. 10 (plot values are given in boldface just below the horizontal axis), relates the number of cover items (corresponding to lines of RTL code) reported by the systems and methods described herein. Test 6 provides an example in which there are 157,469 cover items in a report provided to the user following structural formal verification. For a human user to manually analyze all of these cover items to determine which signals should have checkers written on them to most efficiently close coverage holes would take a substantial amount of time. As compared to methods that report only unchecked cover items, the methods and systems of the present application can report only 100 signals which will cover all of these 157,469 cover items. Moreover, because the reported signals are ranked, a user can immediately proceed to write a new checker on the top reported signal to achieve substantial progress in closing coverage holes, without spending time manually analyzing lists of cover items in a report.

The graph of FIG. 11 is similar to that of FIG. 10, but with functional analysis rather than structural analysis used for the formal verification method. Plot 1102 in FIG. 11 relates the number of cover items (corresponding to lines of RTL code) reported by conventional reporting methods for each of six designs. Plot 1104, which is, again, nearly indistinguishable from the horizontal axis of FIG. 11 (plot values are given in boldface just below the horizontal axis), relates the number of cover items reported by the systems and methods described herein. Compared to the structural model analysis comparison shown in FIG. 10, the gap between cover items and signals is less, because, as discussed above, holes are generally filled through structural analysis before the more rigorous functional analysis is advanced to. Looking at test 6 again, significant improvement is illustrated by the largest number of cover items (13,515) that are reported by conventional methods versus the much smaller number of signals (100) reported by the systems and methods described herein. Again, it can be shown that these top 100 signals capture all of the design outside the formal verification analysis report (that is, correspond to all 13,515 undetectable cover items).

With reference to test 2 in FIG. 11, it may be possible for a user to write checkers on the 96 reported signals, such that 2606 lines of code will then be covered. This represents the best-case scenario for achieving 100% coverage, and can only be achieved if the 96 checkers can functionally cover the 2606 lines of code. If they fail to do so, some lines of code will remain uncovered, and an additional pass of the method can be performed to identify new unchecked signals.

Figure 12:
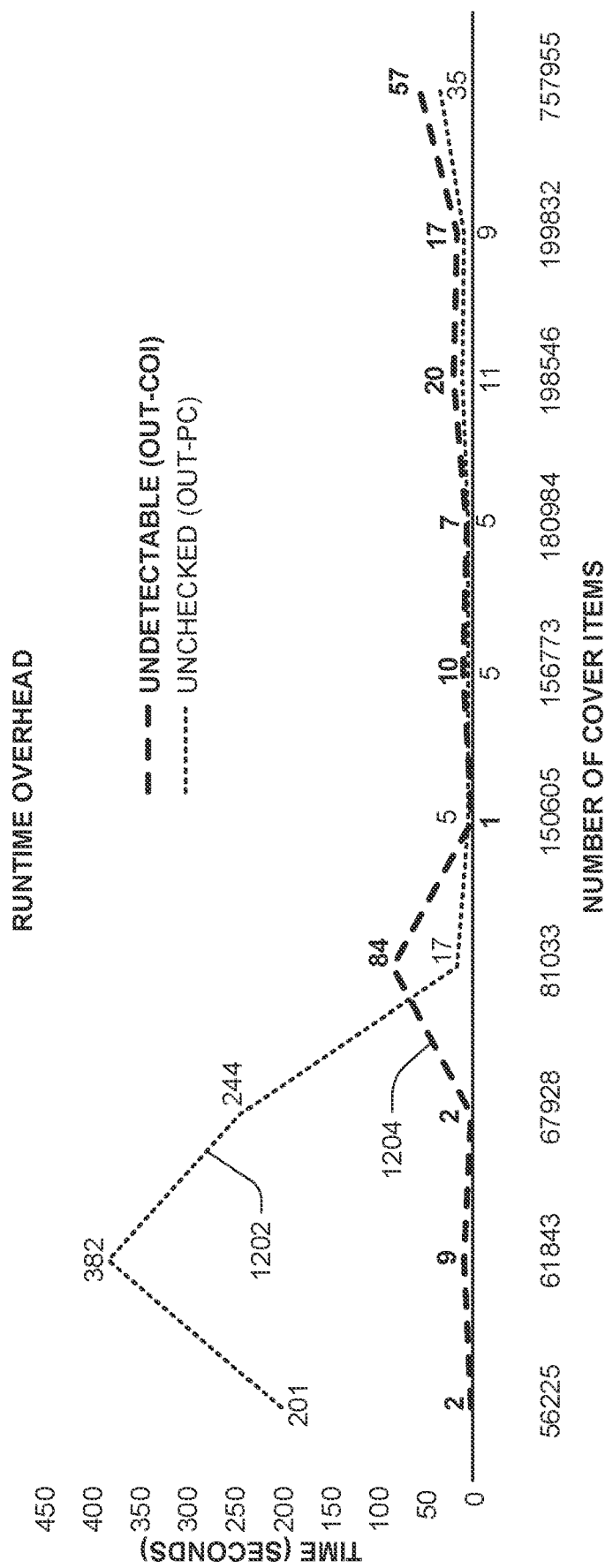
FIG. 12 is an example graph illustrating runtime overhead of methods and systems of the present application.

The graph of FIG. 12 illustrates runtime overhead of methods and systems of the present application. Plot 1204 relates to structural analysis whereas plot 1202 relates to functional analysis. Each plot 1202, 1204 shows the time needed to calculate the number of signals necessary to cover the number of cover items indicated along the horizontal axis. With regard to plot 1204, for example, it takes structural analysis 2 seconds to cover 56,225 cover items, and with regard to plot 1202, it takes 201 seconds to cover the same 56,225 cover items. The graph of FIG. 12 covers analysis compute time only, not user time in performing the manual aspects of coverage analysis and writing new checkers.

Methods and systems described herein provide RTL-signal-based reporting of holes, enabling users to more easily add or revise checkers to achieve formal verification analysis completeness. In particular, the reporting of signals (as opposed to coverage items) sorted by probable importance to the accomplishment of complete checker coverage can greatly reduce the manual workload of a human user and speed the formal verification process, achieving faster signoff and reducing the cost of designing fabricated digital circuit products.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A computer-implemented method of checker completeness analysis comprising:
    with a computer processor, measuring checker coverage following completion of a structural or functional formal verification analysis of a circuit design;
    with the computer processor, performing register transfer level (RTL) based analysis of holes in the checker coverage to determine a list of interest signals on which one or more checkers can be written to reduce holes in the checker coverage;
    with the computer processor, ranking each signal in the list of interest signals in an order determined by its respective probable impact on the reduction in holes in the checker coverage; and
    reporting, via a graphical user interface, the ranked list of interest signals.

2. The method of claim 1, further comprising a human user selecting an interest signal from among the ranked list of interest signals and writing a checker on the selected interest signal prior to re-execution of the formal verification analysis.

3. The method of claim 1, wherein the probable impact of the signals on reduction of holes in the checker coverage is determined by size of the respective cones of influence of each of the respective interest signals.

4. The method of claim 3, wherein the probable impact of the signals on reduction of holes in the checker coverage is further determined by relative distance of the respective cone of influence of each interest signal to cones of influence of other interest signals within the design.

5. The method of claim 1, wherein the reported ranked list of interest signals includes, displayed as associated with the respective interest signals, a respective list of one or more cover items associated with the respective interest signal and collected from a structural cone of influence of the respective interest signal.

* * * * *